(12) United States Patent
Kim (10) Patent No.: US 6,181,560 B1
(45) Date of Patent: Jan. 30, 2001

(54) SEMICONDUCTOR PACKAGE SUBSTRATE AND SEMICONDUCTOR PACKAGE

(75) Inventor: Sun Dong Kim, Choongcheongbuk-Do (KR)

(73) Assignee: Hyundai Electronics Industries Co., Ltd., Ichon (KR)

( * ) Notice: Under 35 U.S.C. 154(b), the term of this patent shall be extended for 0 days.

This patent is subject to a terminal disclaimer.

(21) Appl. No.: 09/412,646

(22) Filed: Oct. 5, 1999

Related U.S. Application Data (60) Division of application No. 09/027,185, filed on Feb. 20, 1998, now Pat. No. 5,963,796, and a continuation-in-part of application No. 08/687,929, filed on Jul. 29, 1996, now Pat. No. 6,002,170, and a continuation-in-part of application No. 08/749,963, filed on Nov. 18, 1996, now Pat. No. 5,877,561.

(30) Foreign Application Priority Data

| Jul. 28, 1995 | (KR) | 95-22839 |
| Dec. 29, 1995 | (KR) | 95-67332 |
| Mar. 27, 1997 | (KR) | 97-10773 |

(51) Int. Cl.[7] ................................. H05K 7/20

(52) U.S. Cl. .......... 361/704; 361/702; 361/707; 361/709; 257/706; 257/708; 257/713; 174/16.3; 165/80.3

(58) Field of Search ................. 361/700–704, 361/707–714, 715–722; 257/706–727, 676, 796, 698, 692, 690, 666, 685–686, 679, 723, 724; 438/125, 123, 106; 174/16.3, 52.1, 52.4; 156/193, 172; 29/825, 849, 842, 845

(56) References Cited

U.S. PATENT DOCUMENTS

| 3,290,564 | 12/1966 | Wolff ................................ 317/234 |
| 3,947,867 | 3/1976 | Duffek et al. ...................... 357/70 |
| 4,396,936 | 8/1983 | McIver et al. ..................... 357/81 |
| 4,420,767 | 12/1983 | Hodge et al. ...................... 357/81 |
| 4,737,217 | * 4/1988 | Nied .................................. 156/193 |
| 4,818,821 | * 4/1989 | Wenworth et al. ............... 174/52.4 |
| 4,975,761 | 12/1990 | Chu ................................... 357/72 |
| 5,012,386 | 4/1991 | McShane et al. ................. 361/386 |

(List continued on next page.)

FOREIGN PATENT DOCUMENTS

| 95-22839 | 7/1995 | (KR) . |

Primary Examiner—Leo P. Picard
Assistant Examiner—Michael Datskovsky
(74) Attorney, Agent, or Firm—Fleshner & Kim, LLP (57) ABSTRACT

A component for forming a chip package includes a flat insulative plate. A heat sink is embedded in a central portion of the plate, and a plurality of electrically conductive leads are embedded in peripheral portions of the insulative plate. The leads extend from the top surface of the plate to the bottom surface of the plate, and may also be exposed on side edges of the plate. A recess for receiving a chip may be formed at a central portion of the plate. A chip package utilizing the plate would include a chip mounted on the heat sink, a plurality of wires or solder bumps that connect bond pads on the chip to corresponding leads in the plate, and an insulating material that covers the chip. The insulating material could be a molding resin, or a separate cover plate that covers the chip. In the case of a cover plate, the cover plate may also include an embedded heat sink and embedded leads that can be connected to the embedded leads of the insulative plate.

20 Claims, 8 Drawing Sheets

U.S. PATENT DOCUMENTS

| | | | | |
|---|---|---|---|---|
| 5,157,475 | * | 10/1992 | Yamaguchi | 257/68 |
| 5,339,518 | | 8/1994 | Tran et al. | 438/123 |
| 5,455,384 | | 10/1995 | Ichihara | 174/52.2 |
| 5,471,011 | | 11/1995 | Maslakow | 174/52.4 |
| 5,490,324 | | 2/1996 | Newman | 29/830 |
| 5,523,622 | | 6/1996 | Harada et al. | 257/734 |
| 5,536,362 | | 7/1996 | Love et al. | 438/125 |
| 5,574,309 | | 11/1996 | Papapietro et al. | 257/679 |
| 5,600,101 | | 2/1997 | Sakai | 174/261 |
| 5,604,328 | | 2/1997 | Kubota et al. | 174/52.1 |
| 5,608,265 | | 3/1997 | Kitano et al. | 257/738 |
| 5,756,377 | | 5/1998 | Ohsawa | 438/123 |
| 5,877,561 | * | 3/1999 | Kim | 257/796 |
| 6,002,170 | * | 12/1999 | Kim | 257/698 |

\* cited by examiner

SEMICONDUCTOR PACKAGE SUBSTRATE AND SEMICONDUCTOR PACKAGE

This application is a Divisional of application Ser. No. 09/027,185 filed Feb. 20, 1998 now U.S. Pat. No. 5,963,796 and a continuation-in-part of application Ser. No. 08/687,929, which was filed Jul. 29, 1996 now U.S. Pat. No. 6,002,170, and a continuation in part of application Ser. No. 08/749,963, filed Nov. 18, 1996, now U.S. Pat. No. 5,877,561.

BACKGROUND OF THE INVENTION

1. Field of the Invention

The present invention relates to a fabrication method for a semiconductor package substrate and a semiconductor package, and more particularly, to a fabrication method for a column lead package (CLP).

2. Background of the Related Art

Figure 1:
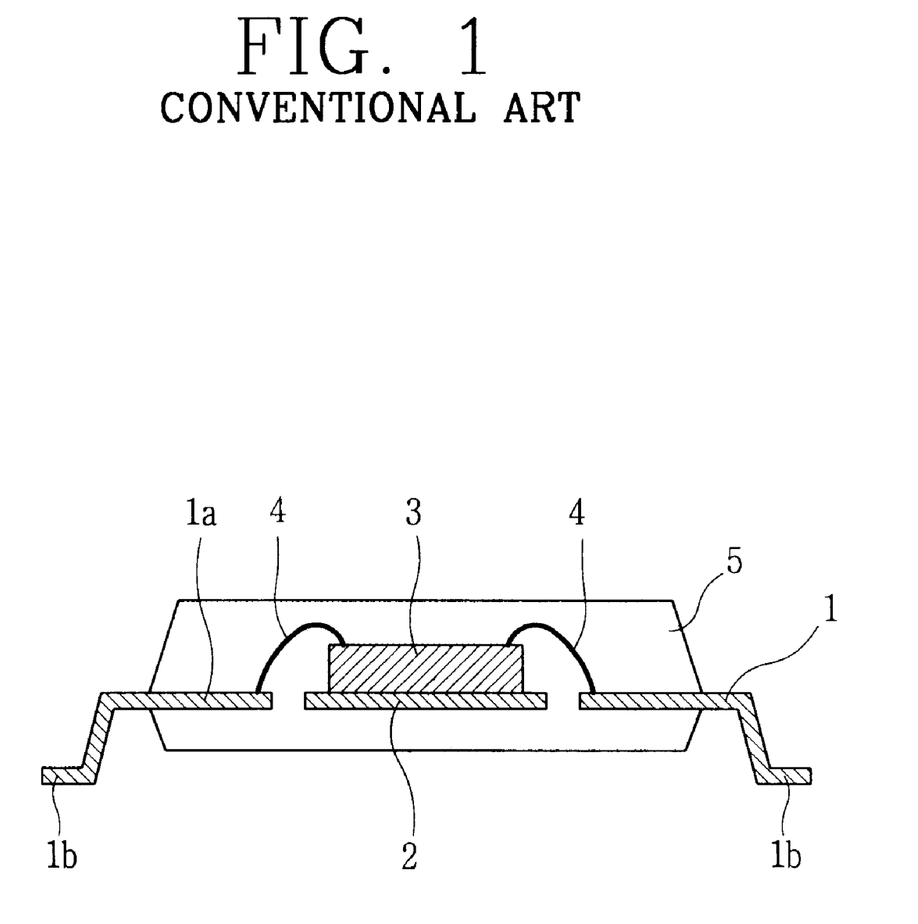
FIG. 1 is a plan view showing a conventional QFP.

FIG. 1 shows a cross-sectional view of a Quad Flat Package, in which a semiconductor chip 3 is mounted on a paddle 2 of a lead frame 1. The chip 3 is electrically connected to inner leads 1a of the lead frame 1 by bonding wires 4, and the entire whole body 5 except for outer leads 1b is encapsulated by an epoxy molding compound.

The Quad Flat Package is disadvantageous since precise alignment of the outer leads 1b onto the bonding pads of a printed circuit board (PCB) is difficult. Further, the outer leads 16 may be damaged or deformed due to external impacts during the lead-forming process in which the outer leads 16 are bent into prescribed shapes. The repairing of the chip package defects when mounted on a PCB has been troublesome, and simplification of the fabrication process has been difficult.

SUMMARY OF THE INVENTION

In one embodiment of the present invention, a semiconductor package includes: a plate within which a plurality of leads and a heat sink are embedded; a semiconductor chip attached to the heat sink of the plate; a plurality of metal wires for electrically connecting a plurality of the leads of the plate and the semiconductor chip; and an epoxy molding compound for encapsulating a predetermined portion of the plate.

In alternate embodiments, a recess may be formed in an upper surface plate, and the chip may be mounted in the recess. In this embodiment, a cover member may be attached to upper portions of the plate to encapsulate the chip. The cover may have embedded metallic leads that are in registration with the metallic leads of the plate.

In other embodiments of the invention, a second substrate having a hole at its central portion is stacked on a first substrate to form a combined substrate having a recess, instead of forming a cavity by grinding the central portion of a single semiconductor package substrate.

In each of the embodiments, the leads may be embedded in the substrate such that portions of the leads are exposed along side edges to the substrate. Bond pads of the semiconductor chip may be connected to the leads with metal wires. An insulating material can then be used to package the chip, the metal wires and portions of the leads and the substrate.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

A method of making a device embodying the invention will now be described with reference to FIGS. 2A–2G.

Figure 2A:
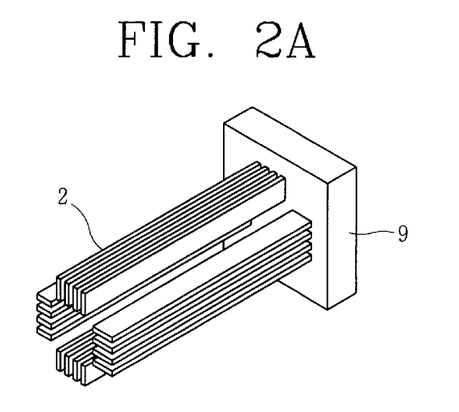
FIGS. 2A through 2G are views showing a fabrication method for one of the preferred embodiments of a CLP according to the invention.
Figure 2B:
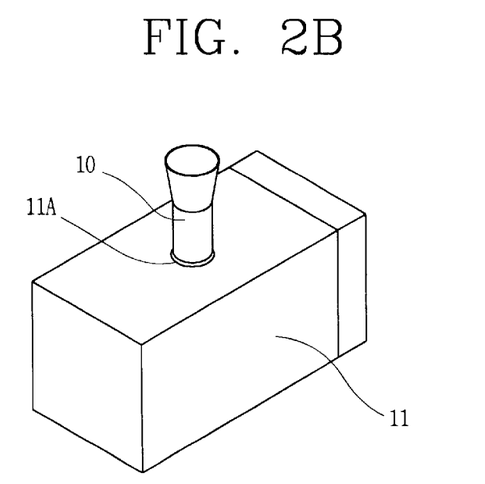
Figure 2C:
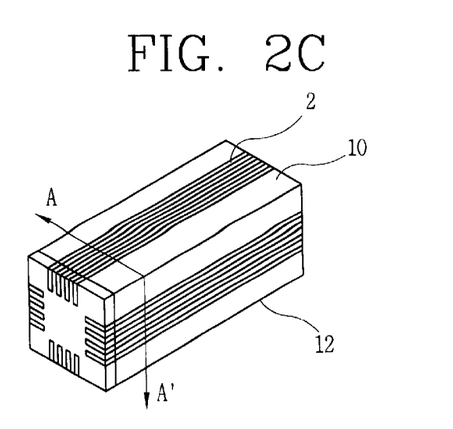

First, as shown in FIG. 2A, a plurality of column lead frames 2, formed of a conductive material, are supported in a plurality of recesses in an upper surface of a column lead frame support 9. The entire body shown in FIG. 2A is then inserted into a mold 11, as shown in FIG. 2B. Next, a liquid insulating resin 10 fills the mold 11 through a hole 11A formed in the mold 11. When the liquid insulating resin 10 hardens, the mold 11 is removed and a unit column frame 12, as shown in FIG. 2C, is obtained.

Figure 2D:
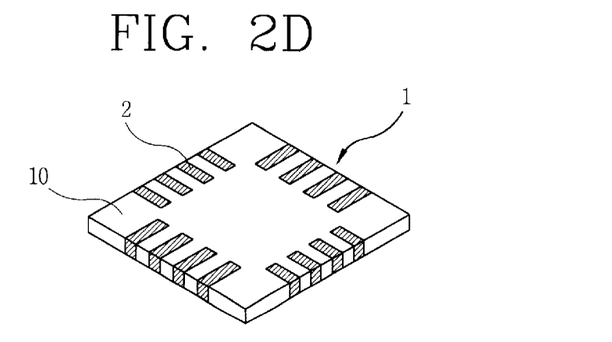
Figure 2E:
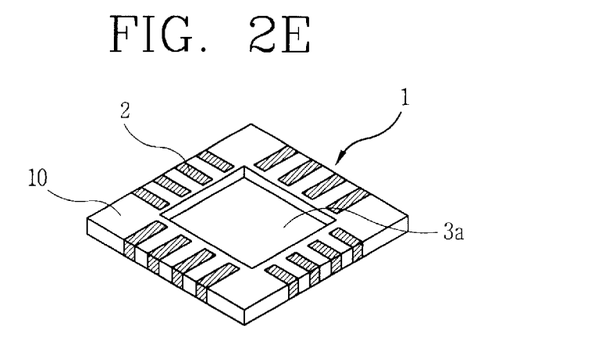

When the unit column frame 12 is sliced along the line A–A', a flat first substrate 1 having leads 2 embedded within hardened insulating resin 10 is obtained, as shown in FIG. 2D. As shown in FIG. 2E, a cavity 3a is formed in a central portion of the first substrate 1 for receiving a chip 3. The cavity is formed by a grinding or polishing process.

Figure 2F:
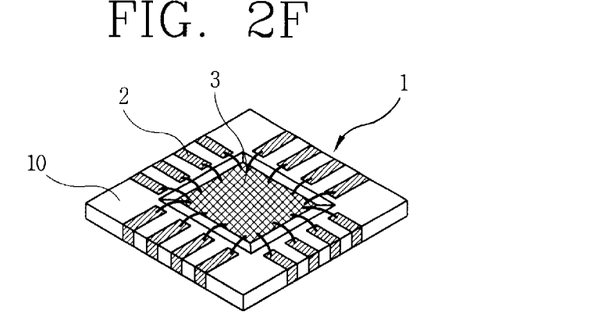
Figure 2G:
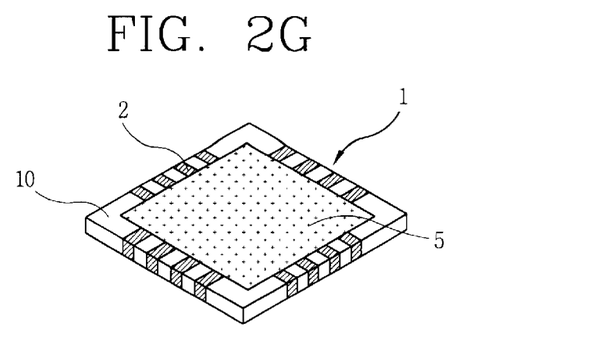

A bonding material (not shown) is then applied to a surface of the cavity 3a. A die bonding process is carried out to attach a chip 3 in the cavity 3a. Next, a wire bonding process is performed to electrically couple bond pads on the semiconductor chip 3 to the leads 2 of the substrate 1 via a plurality of wires 4. As shown in FIG. 2G, an epoxy molding compound 5 is then applied over the semiconductor chip 3 to complete fabrication of the semiconductor package. Such a package is disclosed in application Ser. No. 08/687,929 which is incorporated herein by reference.

An alternate embodiment of the invention will now be described with reference to FIGS. 3A–3I. In this embodiment, it is not necessary to form a recess in a top surface of the substrate by a grinding or a polishing operation.

First, a first substrate 1 is formed as shown in FIG. 2D, according to the method shown in FIGS. 2A through 2C. In an alternative embodiment, the first substrate may have a heat dissipating portion disposed in a central portion thereof, as disclosed in application Ser. No. 08/749,963, which is incorporated herein by reference. In such an embodiment, a conductive column is inserted into the central portion of the leads 2 of FIG. 2A prior to the step illustrated in FIG. 2B. A semiconductor chip mounted on the heat dissipating portion will be able to more easily conduct heat outside the package. Next, a second substrate is formed as will be described below with reference to FIGS. 3A–3E.

Figure 3A:
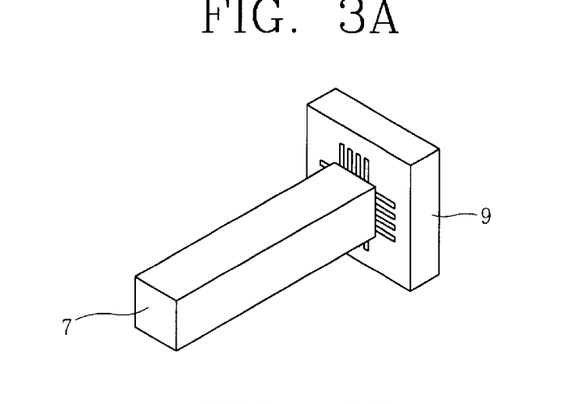
FIGS. 3A through 3I are views showing another fabrication method for another embodiment of a CLP according to the invention.
Figure 3B:
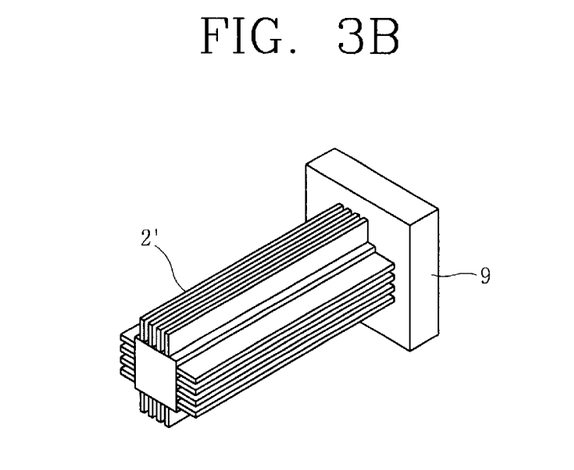
Figure 3C:
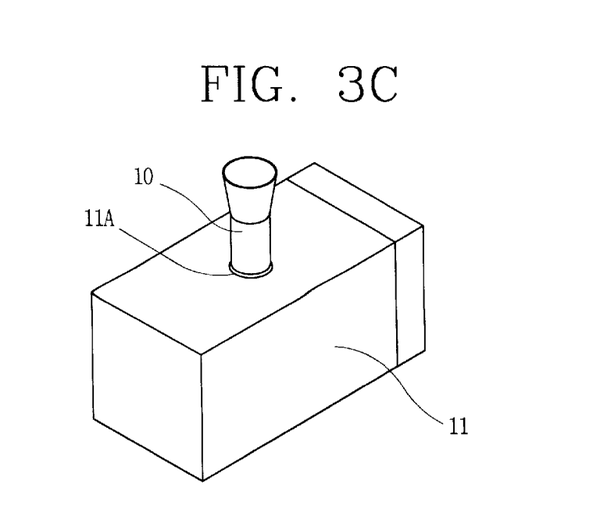
Figure 3D:
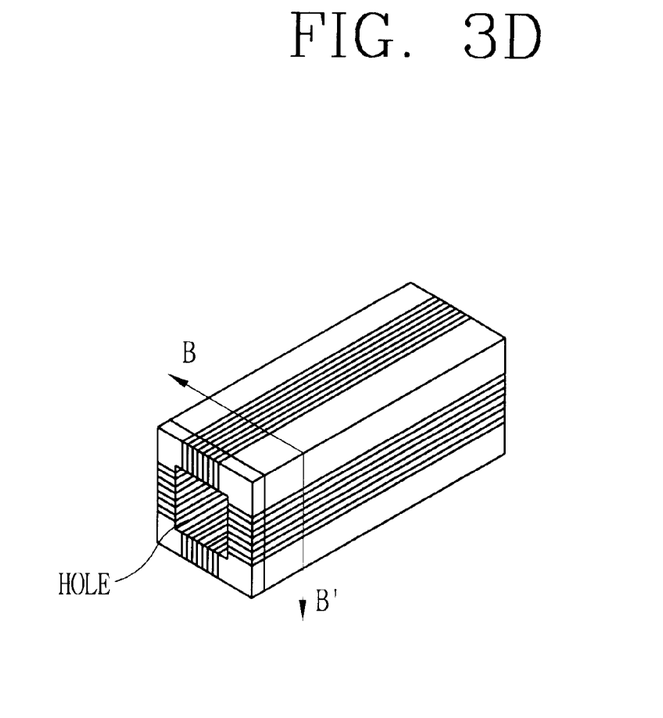
Figure 3E:
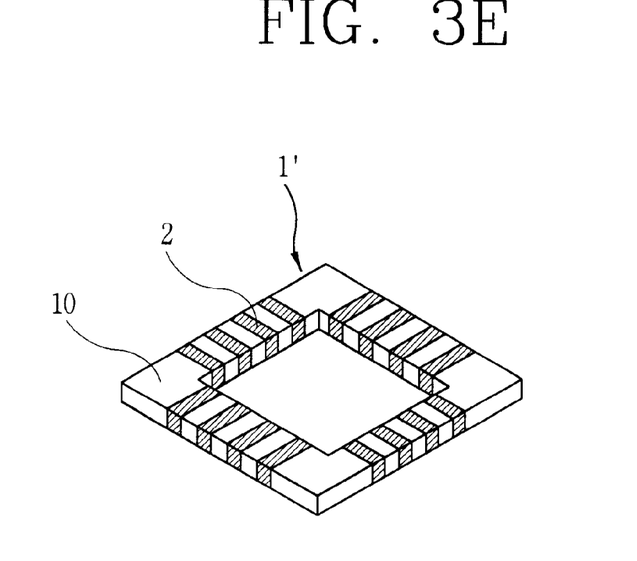

As shown in FIG. 3A, an internal mold 7 is supported on a column lead frame support 9. Next, as shown in FIG. 3B, a conductive material 2', which will serve as the column lead frame is supported around the internal mold 7. Then, as shown in FIG. 3C, the entire body of FIG. 3B is put in the external mold 11 and a liquid insulating resin 10 is poured through a hole 11A formed on the external mold 11. The liquid insulting resin 10 is hardened, and the internal mold 7 and the external mold 11 are removed, resulting in the fabrication of a unit column frame having an empty or open central portion, as shown in FIG. 3D. The unit column frame is sliced along the line B–B', resulting in a second substrate 1', as shown in FIG. 3E. The second substrate 1' also has leads with an upper, lower and side surface exposed. The second substrate 1' also has a central aperture extending therethrough.

Figure 3F:
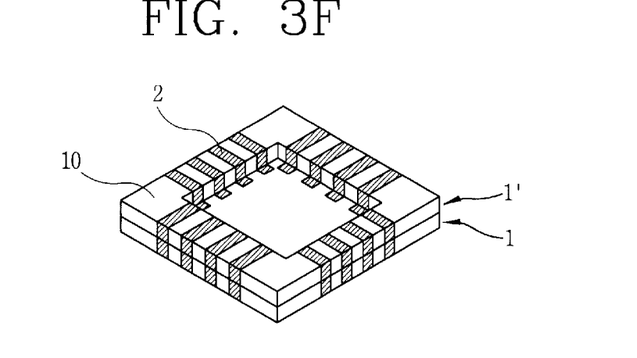
Figure 3G:
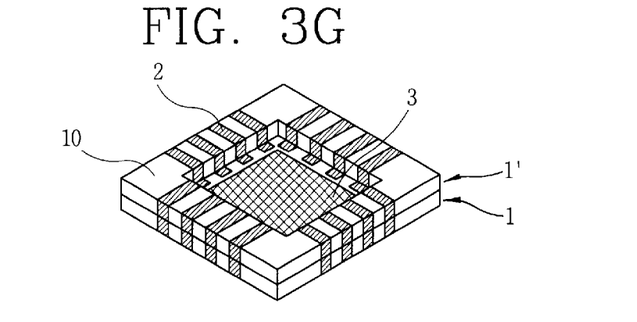
Figure 3H:
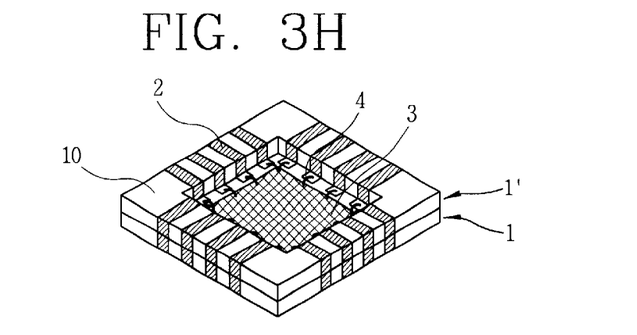

Then, as shown in FIG. 3F, the second substrate 1' is placed on and attached to the first substrate 1. The attachment may be carried out by applying a solder on the attaching surface of the leads of the first and second substrates 1,1' or by using a tape made of insulating material and conductive material. If the leads 2 are formed of lead, the lead may be melted by heating the semiconductor package substrates 1,1', resulting in the fabrication of the semiconductor package substrate as shown in FIG. 3F. As shown in FIG. 3G, a semiconductor chip 3 is then attached in the recess at the central portion formed by the first and second substrates 1,1'. As shown in FIG. 3H, a wire bonding process is then carried out to attach bond pads on the semiconductor chip 3 to corresponding leads via a plurality of wires 4.

Figure 3I:
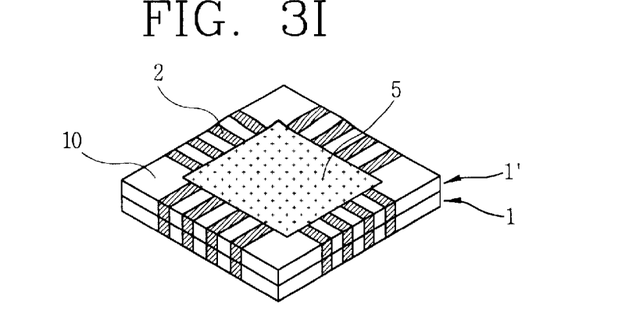

In alternate embodiments, the chip may be attached to the leads of the second substrate 1' via a plurality of wires 4. In still other embodiments, bond pads of the semiconductor chip 3 may be mounted on and attached to the leads of the first substrate 1 via a plurality of solder balls. After the semiconductor chip 3 is connected to the leads, a molding process is performed, as shown in FIG. 3I, resulting in a completed semiconductor package. In an alternate embodiment, an upper surface of the semiconductor chip 3 could be left exposed outside the molding compound to better conduct heat outside the package.

A fabrication method for a semiconductor package according to the above described embodiments can prevent a semiconductor package substrate from being broken by a grinding or a polishing operation. Also, the above-described process eliminates the need to carry out the difficult and time consuming grinding process needed to form a rectangular cavity in a center of the substrate for receiving a chip. This reduces costs and enhances productivity.

As mentioned above, in still other embodiments of the invention, the chip package has a heat sink which is capable of more easily conducting heat generated in the interior of a semiconductor package outside the package. This semiconductor package is also created by fabricating a semiconductor package using a unit column frame, within which a plurality of leads and a heat sink are embedded. The plate type package body is sliced from the unit column frame at regular intervals.

Figure 4A:
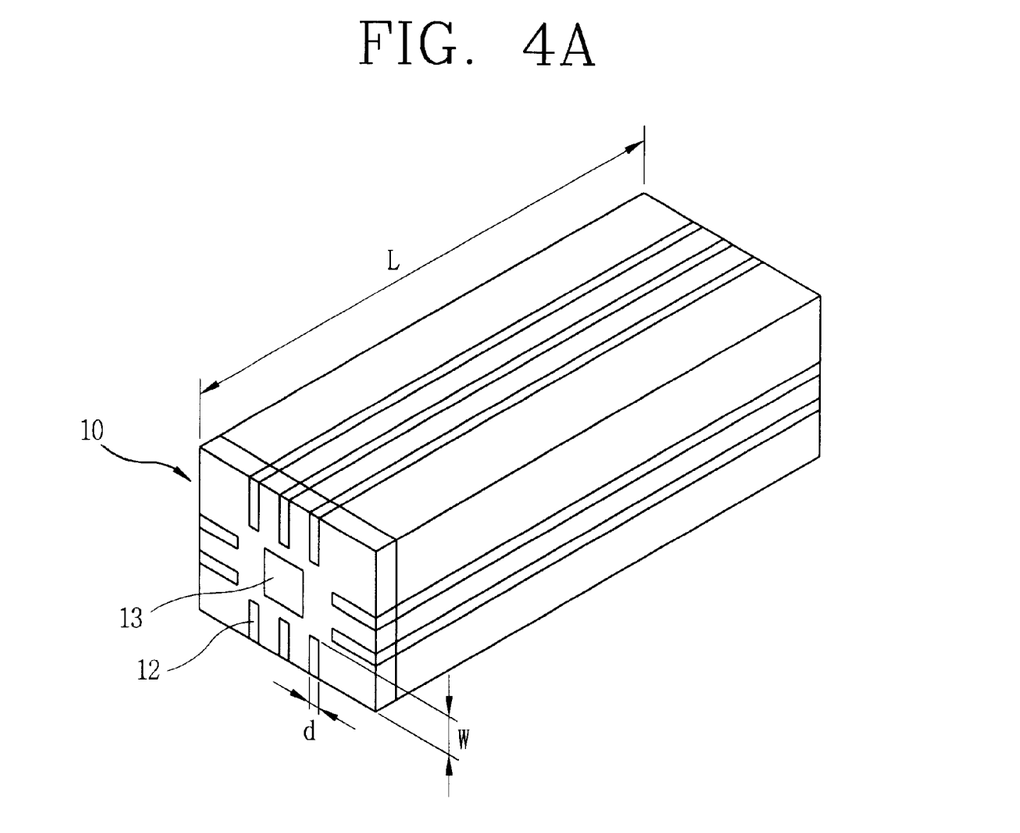
FIG. 4A is a perspective view of a column of material for forming individual plates and FIG. 4B shows a plate that has been separated from the column.
Figure 4B:
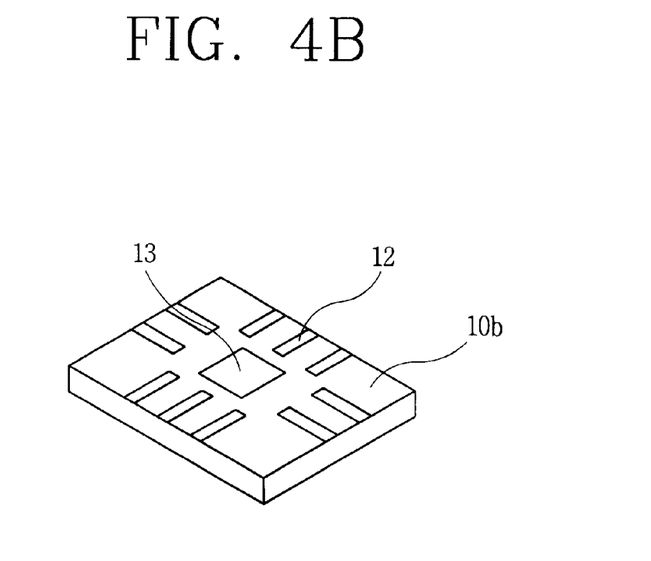

FIGS. 4A and 4B show a unit column frame and a sliced plate in accordance with this embodiment of the present invention. As shown therein, the unit column frame 10 includes a column-shaped body having a predetermined length (l), a column-shaped heat sink 13 embedded within the center portion of the body, and a plurality of leads 12 which are arranged at a periphery of the heat sink 13. The heat sink 13 is exposed to the upper and lower surfaces of the body, and predetermined portions of the leads 12 are exposed on side surfaces of the body by a predetermined thickness (d). In the drawing, the one-dot-one-dash lines denote a cut-away portion of the body.

The column-type body is generally made of an insulation material. The column-type body is made in a square shape or other appropriate shape, e.g., circular. Other shapes can be adapted to the present invention. The unit column frame is sliced at a desired interval (thickness) for example by 1 mm, 1.5 mm, or 2.0 mm. The sliced unit column frame becomes a plate, as shown in FIG. 4B, which is used for fabricating a semiconductor package.

Figure 5:
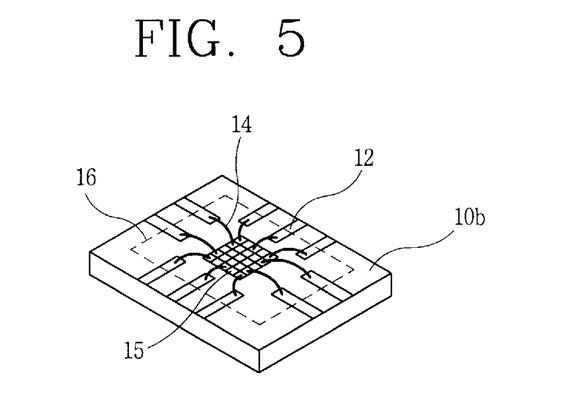
FIG. 5 is a perspective view of a plate type semiconductor package having a heat sink according to an embodiment of the present invention.

FIG. 5 shows a plate-shaped semiconductor package having a heat sink according to this embodiment of the present invention. As shown therein, a semiconductor chip 15 is mounted on the heat sink 13, and bond pads of the semiconductor chip 15 and a plurality of leads 12 are electrically bonded to each other using metal wires 14. The reference numeral 16 denotes a molding line. The upper portion of the plate 10b is sealingly encapsulated and hardened using an epoxy molding compound (not shown).

Figure 6:
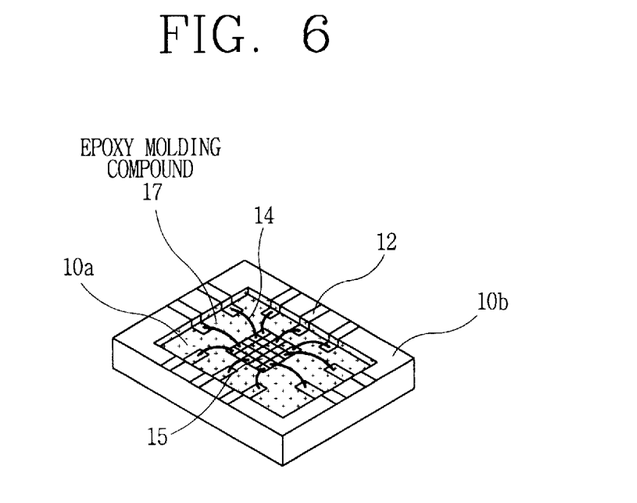
FIG. 6 is a perspective view of a plate type semiconductor package having a heat sink according to an embodiment of the present invention.

FIG. 6 shows a plate-shaped semiconductor package having a heat sink according to another embodiment of the present invention. As shown therein, a recess 10a is formed by grinding or polishing a portion of the upper surface of the plate 10b, which is sliced from the unit column frame 10. Thereafter, a semiconductor mounting process, and a wire bonding process, which are described in the previous embodiment, are conducted. The recess 10a is encapsulated using an epoxy molding compound 17, thus forming a semiconductor package, whereby it is possible to fabricate a thinner semiconductor package as compared to the previous embodiment of the present invention.

Figure 7:
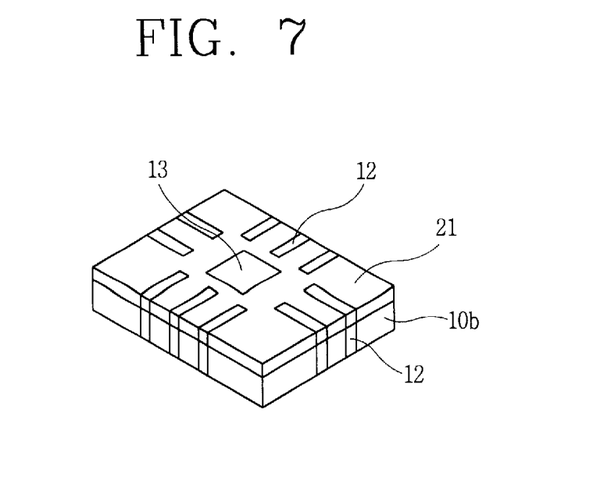
FIG. 7 is a perspective view of a plate type semiconductor package having a heat sink according to another embodiment of the present invention.

FIG. 7 shows a plate-shaped semiconductor package having a heat sink according to yet another embodiment of the present invention. In this embodiment, a cover 21 is used to encapsulate the chip instead of the epoxy molding compound of the previous embodiment. The cover 21 may be obtained by slicing the unit column frame 10. The plate 10b and the cover 21 may have different thicknesses.

A plate having a heat sink and a column type semiconductor package of the present invention prevents a bending of leads that may occur with the prior art device shown in FIG. 1. In addition, it is possible to more easily mount the chip on the substrate since a plurality of leads and the upper and lower surfaces of the plate- or column-shaped semiconductor package are exposed. In addition, lamination type structure is possible, so that the maintenance is easy.

Since the heat sink is exposed to the upper and lower surfaces of the plate- or column-shaped semiconductor package are exposed, heat from the interior of the package can be more effectively conducted outside the package, thus reducing malfunctions of the chip. The cost of the fabrication process can be reduced, and productivity is increased, as compared to the conventional semiconductor package fabrication process.

Although the preferred embodiments of the present invention have been disclosed for illustrative purposes, those skilled in the art will appreciate that various modifications, additions and substitutions are possible, without departing from the scope and spirit of the invention as described in the accompanying claims.

The foregoing embodiment is merely exemplary and not to be construed as limiting the present invention. The present invention can be readily applied to other type of semiconductor packages. One of ordinary skill in the art can use the teachings of the present invention to other devices requiring easier and smaller fabrication of semiconductor packages. The description of the present invention is intended to be illustrative, and not limiting the scope of the claims. Many alternatives, modifications and variations will be apparent to those skilled in the art.

What is claimed is:

1. A component for forming a chip package, comprising:
   a plate having first and second opposing surfaces;
   a heat conducting member formed in the plate, wherein a lower surface of the heat conducting member is substantially flush with the second surface of the plate; and
   a plurality of electrically conductive members formed in the plate and configured to be electrically coupled to bond pads of a chip mounted on the plate, wherein the electrically conductive members extend substantially from the first surface to the second surface of the plate, and wherein the component is configured so that a chip can be mounted on the first surface of the plate.

2. The component of claim 1, wherein the heat conducting member is embedded in an interior portion of the plate.

3. The component of claim 1, wherein the heat conducting member is configured to conduct heat away from a chip mounted on the first surface of the plate.

4. The component of claim 3, wherein the plate comprises an insulative material.

5. The component of claim 1, wherein the electrically conductive members are formed adjacent a periphery of the plate.

6. The component of claim 1, wherein portions of the electrically conductive members are exposed along side edges of the plate.

7. A chip package, comprising:
   a) a plate having first and second surfaces, said plate having:
      i) a heat conducting member embedded in the plate; and
      ii) a plurality of electrically conductive members embedded in the plate such that the electrically conductive members extend between the first and second surfaces of the plate;
   b) an chip mounted on the first surface of the plate;
   c) a plurality of conductive media connecting bond pads of the chip to corresponding ones of the electrically conductive members; and
   d) an insulative material that packages the chip, the plurality of conductive media, and a portion of the plate.

8. The package of claim 7, wherein the plurality of conductive members are formed adjacent peripheral edges of the plate.

9. The package of claim 7, wherein a portion of at least one of the conductive members is exposed along a side edge of the plate.

10. The package of claim 7, wherein the insulative material also packages at least a portion of the electrically conductive members.

11. The package of claim 7, wherein a bottom surface of the heat conducting member is substantially flush with the second surface of the plate.

12. The package of claim 11, wherein the heat conducting member is configured to conduct heat from the chip to an exterior of the package.

13. The package of claim 7, wherein the first surface of the plate includes a recessed portion, and wherein the chip is mounted in the recessed portion.

14. The package of claim 13, wherein the insulative material comprises a cover mounted on an upper portion of the first surface of the plate such that the chip is encapsulated inside the recess.

15. The package of claim 14, wherein a plurality of conductive members are also embedded in the cover, and wherein the plurality of conductive members in the cover are electrically coupled to corresponding ones of the conductive members in the plate.

16. A chip package, comprising:
   a) a plate having first and second surfaces, said plate having:
      i) a heat conducting member embedded in the plate, and
      ii) a plurality of electrically conductive members embedded in the plate such that the electrically conductive members extend between the first and second surfaces of the plate;
   b) a chip mounted on a recess formed on the first surface of the plate;
   c) a plurality of conductive media connecting bond pads of the chip to corresponding ones of the electrically conductive members; and
   d) a cover mounted on an upper portion of the first surface of the plate, wherein the cover includes a plurality of electrically conductive members that are coupled to corresponding ones of the electrically conductive members in the plate.

17. The package of claim 16, wherein the electrically conductive members of the cover are embedded in the cover such that the electrically conductive members extend between upper and lower surfaces of the cover.

18. The package of claim 17, wherein the electrically conductive members of the cover are also exposed on side surfaces of the cover.

19. The component of claim 1, wherein the component is configured so that a chip can be mounted on the heat conducting member formed in the plate.

20. The package of claim 7, wherein the chip is mounted on the heat conducting member embedded in the plate.

* * * * *